(12) United States Patent
Ward et al.

(10) Patent No.: US 11,597,854 B2
(45) Date of Patent: Mar. 7, 2023

(54) METHOD TO INCREASE BARRIER FILM REMOVAL RATE IN BULK TUNGSTEN SLURRY

(71) Applicant: Cabot Microelectronics Corporation, Aurora, IL (US)

(72) Inventors: William J. Ward, Glen Ellyn, IL (US); Matthew E. Carnes, Chicago, IL (US); Ji Cui, Hsin-Chu (TW); Helin Huang, Aurora, IL (US)

(73) Assignee: CMC Materials, Inc., Aurora, IL (US)

( * ) Notice: Subject to any disclaimer, the term of this patent is extended or adjusted under 35 U.S.C. 154(b) by 234 days.

(21) Appl. No.: 16/513,404

(22) Filed: Jul. 16, 2019

(65) Prior Publication Data

US 2021/0017421 A1    Jan. 21, 2021

(51) Int. Cl.
| | |
|---|---|
| C09G 1/02 | (2006.01) |
| C08K 3/22 | (2006.01) |
| C09K 13/00 | (2006.01) |
| C23F 1/26 | (2006.01) |
| H01L 21/306 | (2006.01) |
| C23F 3/06 | (2006.01) |
| C08L 39/00 | (2006.01) |
| C08K 9/00 | (2006.01) |
| C08K 3/36 | (2006.01) |
| C08K 3/28 | (2006.01) |
| H01L 21/321 | (2006.01) |

(52) U.S. Cl.
CPC .................. *C09G 1/02* (2013.01); *C08K 3/22* (2013.01); *C08K 3/28* (2013.01); *C08K 3/36* (2013.01); *C08K 9/00* (2013.01); *C08L 39/00* (2013.01); *C09K 13/00* (2013.01); *C23F 1/26* (2013.01); *C23F 3/06* (2013.01); *H01L 21/30625* (2013.01); *H01L 21/3212* (2013.01); *C08K 2003/2227* (2013.01); *C08K 2201/005* (2013.01)

(58) Field of Classification Search
CPC .. C09G 1/02; C08L 39/00; C08K 9/00; C08K 3/22; C08K 3/28; C08K 3/36; C08K 2003/2227; C08K 2201/005; H01L 21/3212; H01L 21/30625; C23F 1/26; C23F 3/06; C09K 13/00
See application file for complete search history.

(56) References Cited

U.S. PATENT DOCUMENTS

| | | | | |
|---|---|---|---|---|
| 5,993,686 A | * | 11/1999 | Streinz | H01L 21/3213 252/79.3 |
| 6,440,187 B1 | * | 8/2002 | Kasai | B82Y 30/00 106/3 |
| 9,238,754 B2 | | 1/2016 | Grumbine et al. | |
| 9,303,188 B2 | | 4/2016 | Grumbine et al. | |
| 9,303,190 B2 | * | 4/2016 | Ward | H01L 21/30625 |
| 2002/0023389 A1 | | 2/2002 | Minamihaba et al. | |
| 2004/0157535 A1 | * | 8/2004 | Chaneyalew | C09K 3/1463 451/41 |
| 2007/0087667 A1 | * | 4/2007 | Laconto | H01L 21/02024 451/41 |
| 2009/0004863 A1 | * | 1/2009 | Kamimura | C23F 3/04 438/692 |
| 2009/0047787 A1 | * | 2/2009 | Li | C09G 1/02 216/13 |
| 2013/0214199 A1 | * | 8/2013 | Park | C23F 3/06 252/79.1 |
| 2015/0259573 A1 | * | 9/2015 | Grumbine | H01L 21/3212 438/693 |
| 2015/0267082 A1 | * | 9/2015 | Grumbine | H01L 21/30625 438/693 |
| 2016/0089763 A1 | | 3/2016 | Grumbine et al. | |
| 2016/0237315 A1 | | 8/2016 | Stender et al. | |
| 2018/0179417 A1 | * | 6/2018 | Mizutani | C09K 3/1409 |
| 2019/0085209 A1 | | 3/2019 | Docker et al. | |

FOREIGN PATENT DOCUMENTS

WO    2017214185 A1    12/2017

OTHER PUBLICATIONS

Korean Intellectual Property Office, International Search Report and Written Opinion of the International Searching Authority issued in connection with Application No. PCT/US2020/040489 dated Oct. 19, 2020. (Year: 2020).*

Korean Intellectual Property Office, International Search Report and Written Opinion of the International Searching Authority issued in connection with Application No. PCT/US2020/040489 dated Oct. 19, 2020.

Taiwan Intellectual Property Office, Search Report issued in connection with Taiwan Patent Application No. 109122208 dated Jan. 22, 2021.

* cited by examiner

*Primary Examiner* — Allan W. Olsen

(74) *Attorney, Agent, or Firm* — Thomas Omholt; Erika R. Singleton

(57) ABSTRACT

The invention relates to a chemical-mechanical polishing composition comprising (a) a first abrasive comprising cationically modified colloidal silica particles, (b) a second abrasive having a Mohs hardness of about 5.5 or more, (c) a cationic polymer, (d) an iron containing activator, (e) an oxidizing agent, and (f) water. The invention also relates to a method of chemically mechanically polishing a substrate, especially a substrate comprising tungsten and barrier layers (e.g., nitrides), with the polishing composition.

28 Claims, No Drawings

METHOD TO INCREASE BARRIER FILM REMOVAL RATE IN BULK TUNGSTEN SLURRY

BACKGROUND OF THE INVENTION

Chemical mechanical polishing (CMP) compositions and methods for polishing (or planarizing) the surface of a substrate are well known in the art. Polishing compositions (also known as polishing slurries, CMP slurries, and CMP compositions) for polishing metal layers (e.g., tungsten) on a semiconductor substrate may include abrasive particles suspended in an aqueous solution and chemical accelerators such as oxidizers, chelating agents, catalysts, and the like.

In a conventional CMP operation, the substrate (wafer) to be polished is mounted on a carrier (polishing head) which is in turn mounted on a carrier assembly and positioned in contact with a polishing pad in a CMP apparatus (polishing tool). The carrier assembly provides a controllable pressure to the substrate, pressing the substrate against the polishing pad. The substrate and pad are moved relative to one another by an external driving force. The relative motion of the substrate and pad abrades and removes a portion of the material from the surface of the substrate, thereby polishing the substrate. The polishing of the substrate by the relative movement of the pad and the substrate may be further aided by the chemical activity of the polishing composition (e.g., by an oxidizing agent and other chemical compounds present in the CMP composition) and/or the mechanical activity of an abrasive suspended in the polishing composition.

In typical tungsten plug and interconnect processes, tungsten is deposited over a dielectric and within openings formed therein. The excess tungsten over the dielectric layer is then removed during a CMP operation to form tungsten plugs and interconnects within the dielectric. Following bulk tungsten removal, the substrate surface can be subjected to a buff polishing step to remove debris and to provide a more uniform topography to the surface. The buff polishing is demanding in that erosion within substrate features such as the tungsten plugs and interconnects, which is excessive metal removal from within the features leading to nonplanarity, must be minimized or more preferably even reversed. The buffing step involves polishing of two or more different materials, such as tungsten, dielectric, and also barrier materials such as silicon nitride, and thus requires a proper balance of the removal rates of the different materials to achieve suitable surface topography.

In conventional polishing systems the addition of polymeric additives to improve topography, typically results in a significant reduction of barrier film removal rates. The removal rate reduction is greater for the barrier films than it is for the tungsten film. This difference in removal rate change presents challenges in determining the polishing end-point.

Accordingly, there is an ongoing need to develop new polishing methods and compositions for tungsten bulk polishing applications that provide good removal rates and good surface topography and planarity while minimizing or eliminating erosion.

BRIEF SUMMARY OF THE INVENTION

The invention provides a chemical-mechanical polishing composition comprising (a) a first abrasive comprising cationically modified colloidal silica particles, (b) a second abrasive having a Mohs hardness of about 5.5 or more, (c) a cationic polymer, (d) an iron containing activator, (e) an oxidizing agent, and (f) water.

The invention also provides a method of chemically mechanically polishing a substrate comprising (i) providing a substrate, (ii) providing a polishing pad, (iii) providing a chemical-mechanical polishing composition comprising (a) a first abrasive comprising cationically modified colloidal silica particles, (b) a second abrasive having a Mohs hardness of about 5.5 or more, (c) a cationic polymer, (d) an iron containing activator, (e) an oxidizing agent, and (f) water, (iv) contacting the substrate with the polishing pad and the chemical-mechanical polishing composition, and (v) moving the polishing pad and the chemical mechanical polishing composition relative to the substrate to abrade at least a portion of the substrate to polish the substrate.

DETAILED DESCRIPTION OF THE INVENTION

The invention provides a chemical-mechanical polishing composition comprising (a) a first abrasive comprising cationically modified colloidal silica particles, (b) a second abrasive having a Mohs hardness of about 5.5 or more, (c) a cationic polymer, (d) an iron containing activator, (e) an oxidizing agent, and (f) water.

The inventive polishing composition comprises a first abrasive that comprises, consists essentially of, or consists of a cationically modified colloidal silica, that is, colloidal silica modified to have a permanent positive charge. The colloidal silica, prior to cationic modification, can be any suitable colloidal silica. Exemplary colloidal silica particles include, for example, the PL-series of colloidal silica particles commercially available from FUSO Chemical Co. (Tokyo, Japan) (e.g., PL-1, PL-3D and PL-2, PL-7, and PL-10 colloidal silica products).

By permanent positive charge, it is meant that the positive charge on the silica particles is not readily removable, for example, via flushing, dilution, filtration, and the like. A permanent positive charge may be the result, for example, of covalently bonding a cationic compound with the colloidal silica. The cationic compound may reverse charge at a higher pH than would be used during the polishing process, however, the cationic compound remains bound to the colloidal silica. A permanent positive charge is in contrast to a non-permanent positive charge that may be the result, for example, of an electrostatic interaction between a cationic compound and the colloidal silica.

The charge on dispersed particles such as colloidal silica particles is commonly referred to in the art as the zeta potential (or the electrokinetic potential). The zeta potential of a particle refers to the electrical potential difference between the electrical charge of the ions surrounding the particle and the electrical charge of the bulk solution of the polishing composition (e.g., the liquid carrier and any other components dissolved therein). The zeta potential typically is dependent on the pH of the aqueous medium. For a given polishing composition, the isoelectric point of the particles is defined as the pH at which the zeta potential is zero. As the pH is increased or decreased away from the isoelectric point, the surface charge (and hence the zeta potential) is correspondingly decreased or increased (to negative or positive zeta potential values). The zeta potential of a dispersion such as a polishing composition may be obtained using commercially available instrumentation such as the ZETA-SIZER™ available from Malvern Instruments, the ZETA-PLUS® Zeta Potential Analyzer available from Brookhaven Instruments, and an electro-acoustic spectrometer available from Dispersion Technologies, Inc.

The cationically modified colloidal silica particles have a positive charge of at least about 20 mV or more in the polishing composition. More specifically, the cationically modified colloidal silica particles in the polishing composition can have a permanent positive charge (i.e., zeta potential) of about 20 mV or more, e.g., about 25 mV or more, about 30 mV or more, about 35 mV or more, about 40 mV or more, about 45 mV or more, about 50 mV or more, about 55 mV or more, about 60 mV or more, about 65 mV or more, about 70 mV or more, or about 75 mV or more. Alternatively, or in addition, the colloidal silica particles in the polishing composition can have a permanent positive charge (i.e., zeta potential) of about 100 mV or less, e.g., about 95 mV or less, about 90 mV or less, about 85 mV or less, or about 80 mV or less. Tus, the colloidal silica particles can have a permanent positive charge (i.e., zeta potential) bounded by any two of the aforementioned endpoints. Preferably, the colloidal silica particles have a permanent positive charge (i.e., zeta potential) of about 20 mV to about 100 mV (e.g., about 20 mV to about 75 mV, about 25 mV to about 100 mV, about 25 mV to about 75 mV, or about 25 mV to about 50 mV) over a suitable pH range (e.g., a pH of less than or equal to about 4).

The permanent positive charge on the colloidal silica particles can be determined using any suitable method and is not particularly limited. For example, dialysis techniques can be used to characterize the charge of colloidal silica particles. In addition, ultrafiltration methods can also be used. An exemplary three-step ultrafiltration method is described herein. The skilled artisan will recognize that the parameters of the conditions of the ultrafiltration method described herein are illustrative and should not be construed as limiting in any manner.

A volume of the polishing composition (e.g., 200 mL) is passed through a Millipore ULTRACELL™ regenerated cellulose ultrafiltration disk (e.g., having a molecular weight cutoff of 100,000 Daltons and a pore size of 6.3 nm. The remaining dispersion (the dispersion that is retained by the ultrafiltration disk) is collected and replenished to the original volume with pH adjusted deionized water. The deionized water is pH adjusted to the original pH of the polishing composition using a suitable inorganic acid such as nitric acid. This procedure is repeated for a total of three ultrafiltration cycles (each of which includes an ultrafiltration step and a replenishing step). The zeta-potential of the triply ultra-filtered and replenished polishing composition is then measured and compared with the zeta potential of the original polishing composition.

While not wishing to be bound by any particular theory, it is believed that the dispersion retained by the ultrafiltration disk (the retained dispersion) includes the colloidal silica particles and any chemical compounds (e.g., cationic compounds) that may be associated with the surface of the particles (e.g., bonded or attached to or electrostatically interacting with the particle surface). At least a portion of the liquid carrier (e.g., water) and the chemical compounds dissolved therein pass through the ultrafiltration disk. Replenishing the retained dispersion to the original volume is believed to upset the equilibrium in the original polishing composition such that the chemical compounds associated with the particle surface may tend towards a new equilibrium. Compounds that are strongly associated (e.g., covalently bonded) with the particle surface remain on the surface such that there tends to be little if any change in the positive zeta potential of the particle. In contrast, a portion of compounds that have a weaker association (e.g., an electrostatic interaction) with the particle surface may return to the solution as the system tends towards the new equilibrium thereby resulting in a reduction in the positive zeta potential. Repeating this process for a total of three ultrafiltration and replenishing cycles is believed to amplify the above described effect.

It is observed that after correcting for ionic strength differences there is little (or no) difference between the zeta potential of the colloidal silica particles in the original polishing composition and the particles in the triply ultra-filtered and replenished polishing composition obtained from the above described three step ultrafiltration test. It will be understood that prior to correcting for ionic strength differences, the measured zeta potential may be observed to increase due to the reduced ionic strength (owing to dilution) of the triply ultra-filtered and replenished polishing composition. After correcting for ionic strength differences, it is preferred that any reduction in the positive charge (i.e., reduction in the zeta potential) on the particles resulting from the aforementioned three step ultrafiltration test is less than 10 mV (e.g., less than about 7 mV, less than about 5 mV, or less than about 2 mV).

In an embodiment, the cationically modified colloidal silica particles have a zeta potential of greater than about 20 mV at a pH of about 2.5, for example, greater than about 25 mV at a pH of about 2.5, greater than about 30 mV at a pH of about 2.5, greater than about 35 mV at a pH of about 2.5, greater than about 40 mV at a pH of about 2.5, greater than about 45 mV at a pH of about 2.5, or greater than about 50 mV at a pH of about 2.5.

Moreover, as described herein, the inventive polishing compositions have an acidic pH, that is, a pH that is less than 7 (e.g., pH of about 2 to about 5), and as such the cationically modified colloidal silica particles can have any suitable zeta potential described herein at the pH of the polishing composition. In a preferred embodiment, the polishing composition has a pH of about 2 to about 4. For example, in embodiments wherein the pH of the polishing composition is about 2.5, the cationically modified colloidal silica particles can have a zeta potential of about 100 mV or less (e.g., about 95 mV or less, about 90 mV or less, about 85 mV or less, about 80 mV or less, about 75 mV or less, about 70 mV or less, about 65 mV or less, about 60 mV or less, or about 55 mV or less). Alternatively, or in addition, the cationically modified colloidal silica particles can have a zeta potential of about 20 mV or more (e.g., about 25 mV or more, about 30 mV or more, about 35 mV or more, about 40 mV or more, about 45 mV or more, or about 50 mV or more). Thus, the cationically modified colloidal silica particles can have a zeta potential bound by any of the aforementioned endpoints. In a preferred embodiment, the pH of the polishing composition is about 2.5 and the colloidal silica particles have a zeta potential of about 30 mV to about 40 mV (e.g., about 35 mV).

In other embodiments, wherein the pH of the polishing composition is about 3, the cationically modified colloidal silica particles can have a zeta potential of about 100 mV or less (e.g., about 95 mV or less, about 90 mV or less, about 85 mV or less, about 80 mV or less, about 75 mV or less, about 70 mV or less, about 65 mV or less, about 60 mV or less, or about 55 mV or less). Alternatively, or in addition, the cationically modified colloidal silica particles can have a zeta potential of about 20 mV or more (e.g., about 25 mV or more, about 30 mV or more, about 35 mV or more, about 40 mV or more, about 45 mV or more, or about 50 mV or more). Thus, the cationically modified colloidal silica particles can have a zeta potential bound by any of the aforementioned endpoints. In a preferred embodiment, the pH of the polishing composition is about 3 and the colloidal silica particles have a zeta potential of about 40 mV to about 50 mV (e.g., about 45 mV).

In other embodiments, wherein the pH of the polishing composition is about 3.5, the cationically modified colloidal silica particles can have a zeta potential of about 100 mV or less (e.g., about 95 mV or less, about 90 mV or less, about 85 mV or less, about 80 mV or less, about 75 mV or less, about 70 mV or less, about 65 mV or less, about 60 mV or less, or about 55 mV or less). Alternatively, or in addition, the cationically modified colloidal silica particles can have a zeta potential of about 20 mV or more (e.g., about 25 mV or more, about 30 mV or more, about 35 mV or more, about 40 mV or more, about 45 mV or more, or about 50 mV or more). Thus, the cationically modified colloidal silica particles can have a zeta potential bound by any of the aforementioned endpoints. In a preferred embodiment, the pH of the polishing composition is about 3.5 and the colloidal silica particles have a zeta potential of about 45 mV to about 50 mV (e.g., about 47 mV).

In other embodiments, wherein the pH of the polishing composition is about 4, the cationically modified colloidal silica particles can have a zeta potential of about 100 mV or less (e.g., about 95 mV or less, about 90 mV or less, about 85 mV or less, about 80 mV or less, about 75 mV or less, about 70 mV or less, about 65 mV or less, about 60 mV or less, or about 55 mV or less). Alternatively, or in addition, the cationically modified colloidal silica particles can have a zeta potential of about 20 mV or more (e.g., about 25 mV or more, about 30 mV or more, about 35 mV or more, about 40 mV or more, about 45 mV or more, or about 50 mV or more). Thus, the cationically modified colloidal silica particles can have a zeta potential bound by any of the aforementioned endpoints. In a preferred embodiment, the pH of the polishing composition is about 4 and the colloidal silica particles have a zeta potential of about 40 mV to about 50 mV (e.g., about 45 mV).

In other embodiments, wherein the pH of the polishing composition is about 4.5, the cationically modified colloidal silica particles can have a zeta potential of about 100 mV or less (e.g., about 95 mV or less, about 90 mV or less, about 85 mV or less, about 80 mV or less, about 75 mV or less, about 70 mV or less, about 65 mV or less, about 60 mV or less, or about 55 mV or less). Alternatively, or in addition, the cationically modified colloidal silica particles can have a zeta potential of about 20 mV or more (e.g., about 25 mV or more, about 30 mV or more, about 35 mV or more, about 40 mV or more, about 45 mV or more, or about 50 mV or more). Thus, the cationically modified colloidal silica particles can have a zeta potential bound by any of the aforementioned endpoints. In a preferred embodiment, the pH of the polishing composition is about 4.5 and the colloidal silica particles have a zeta potential of about 40 mV to about 45 mV (e.g., about 42 mV).

The cationically modified colloidal silica particles of the first abrasive can be prepared using any suitable method. An exemplary method includes treating colloidal silica particles with at least one cationic compound, for example, an aminosilane compound. Suitable aminosilane compounds include primary aminosilanes, secondary aminosilanes, tertiary aminosilanes, quaternary aminosilanes, and multi-podal (e.g., dipodal) aminosilanes. The aminosilane compound can be any suitable aminosilane, such as bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethylaminopropyl trialkoxysilane, aminopropyl trialkoxysilane, (2-N-benzylaminoethyl)-3-aminopropyl trialkoxysilane), trialkoxysilyl propyl-N,N,N-trimethyl ammonium chloride, N-(trialkoxysilylethyl)benzyl-N,N,N-trimethyl ammonium chloride, (bis(methyldialkoxysilylpropyl)-N-methyl amine, bis(trialkoxysilylpropyl)urea, bis(3-(trialkoxysilyl)propyl)-ethylenediamine, bis(trialkoxysilylpropyl)amine, bis(trialkoxysilylpropyl)amine, and mixtures thereof.

Any suitable method of treating the colloidal silica particles can be employed. For example, the colloidal silica particles may be treated with the aminosilane compound before mixing with the other components of the polishing composition or the aminosilane and the colloidal silica particles may be added simultaneously to the other components of the polishing composition.

In embodiments wherein the aminosilane is added simultaneously to the other components of the polishing composition, the aminosilane compound may be present in the polishing composition in any suitable amount. The amount of aminosilane utilized may depend on several factors, for example, including the particle size, the surface area of the particle, the particular aminosilane compound used, and the desired charge on the particle. As generally understood, the amount of aminosilane used increases with decreasing particle size (and therefore increasing surface area) and increasing charge on the particle. For example, to achieve a permanent positive charge of greater than about 20 mV, 20 ppm on a weight basis or more of aminosilane may be used for a dispersion having a particle size of 110 nm, 70 ppm or more of aminosilane may be used for a dispersion having a particle size of 75 nm, and 130 ppm or more of aminosilane may be used for a dispersion having a particle size of 55 nm. Thus, the polishing composition can include about 5 ppm or more of the aminosilane compound, e.g., about 10 ppm or more, about 15 ppm or more, about 20 ppm or more, about 25 ppm or more, about 30 ppm or more, about 50 ppm or more, about 70 ppm or more, about 85 ppm or more, about 100 ppm or more, about 115 ppm or more, or about 130 ppm or more. The polishing composition preferably includes an amount of aminosilane sufficient to provide the desired permanent positive charge without using an excess. Tus, the polishing composition can include about 500 ppm or less of the aminosilane compound, e.g., about 400 ppm or less, about 300 ppm or less, about 200 ppm or less, about 150 ppm or less, about 130 nm or less, about 100 ppm or less, about 75 ppm or less, or about 60 ppm or less. Tus, the polishing composition can include an amount of aminosilane bounded by any two of the aforementioned endpoints. Preferably, the polishing composition includes about 5 ppm to about 500 ppm of the aminosilane compound, e.g., about 10 ppm to about 300 ppm, about 15 ppm to about 200 ppm, or about 20 ppm to about 150 ppm.

The inventive polishing composition comprises a second abrasive that comprises, consists essentially of, or consists of an abrasive having a Mohs hardness of about 5.5 or more. As used herein, "Mohs hardness" refers to a qualitative ordinal scale characterizing scratch resistance of various minerals through the ability of harder material to scratch softer material. For the purposes of the present invention, the Mohs hardness expressed for the abrasive particle refers to the Mohs hardness of the bulk material from which the abrasive particle was generated. Without wishing to be bound to any particular theory, Applicants have discovered that polishing compositions comprising a "mixed particle abrasive," that is, an abrasive comprising a first abrasive comprising cationically modified colloidal silica particles and a second abrasive having a Mohs hardness, of about 5.5 or more, are particularly suitable for polishing a substrate comprising tungsten, titanium, titanium nitride, or a combination thereof. In keeping with an aspect of the invention, the second abrasive particles are harder, as measured by the Mohs hardness of the bulk material, than the first abrasive comprising cationically modified colloidal silica particles.

The second abrasive can have Mohs hardness of about 5.5 or more, e.g., about 6 or more, about 6.5 or more, about 7 or more, about 7.5 or more, about 8 or more, about 8.5 or more, about 9 or more, about 9.5 or more, or about 10. Alternatively, or in addition, the second abrasive can have a Mohs hardness of about 10 or less, e.g., about 9.5 or less, about 9 or less, about 8.5 or less, or about 8 or less. Thus, the second abrasive can have a Mohs hardness bounded by any two of the aforementioned endpoints. For example, the second abrasive can have a Mohs hardness of about 5.5 to about 10, e.g., about 6 to about 9.5, about 6.5 to about 9, about 7 to about 8.5, or about 7.5 to about 8. In an embodiment, the second abrasive has a Mohs hardness of about 9.

The second abrasive can comprise more than one type of particle having a Mohs hardness of about 5.5 or more. In an embodiment, the second abrasive is selected from α-alumina particles, zirconia particles, diamond particles, and combinations thereof.

In a preferred embodiment, the second abrasive comprises α-alumina particles. In another preferred embodiment, the second abrasive consists of α-alumina particles.

A suitable alumina is α-alumina commercially available for Saint-Gobain (Worcester, Mass.).

In an embodiment, the polishing composition contains cationically modified colloidal silica particles as the first abrasive and α-alumina particles as the second abrasive.

The abrasive particles (i.e., the first abrasive comprising cationically modified colloidal silica particles and second abrasive having a Mohs hardness of about 5.5 or more) can have any suitable size (e.g., primary particle size, average particle diameter, etc.). As used herein, average particle size refers to the weight average particle size ($D_w$), as will be understood by those of ordinary skill in the art. The average particle size of the abrasive particles can be measured using any suitable technique, for example, using laser diffraction techniques. Suitable particle size measurement instruments are available from, e.g., Malvern Instruments (Malvern, UK). If the average particle size of the abrasive particles is too small, the polishing composition may not exhibit sufficient removal rate. In contrast, if the average particle size of the abrasive particles is too large, the polishing composition may exhibit undesirable polishing performance such as, for example, poor substrate defectivity. Accordingly, the abrasive particles can have an average particle size of about 10 nm or more, for example, about 15 nm or more, about 20 nm or more, about 30 nm or more, about 40 nm or more, about 50 nm or more, about 60 nm or more, about 70 nm or more, about 80 nm or more, about 90 nm or more, or about 100 nm or more. Alternatively, or in addition, the abrasive particles can have an average particle size of about 1,000 nm or less, for example, about 750 nm or less, about 500 nm or less, about 400 nm or less, about 300 nm or less, or about 200 nm or less. Thus, the abrasive particles can have an average particle size bounded by any two of the aforementioned endpoints. For example, the abrasive particles can have an average particle size of about 10 nm to about 1,000 nm, about 20 nm to about 750 nm, about 30 nm to about 500 nm, about 40 nm to about 400 nm, about 50 nm to about 300 nm, about 60 nm to about 300 nm, about 70 nm to about 300 nm, about 80 nm to about 300 nm, about 90 nm to about 300 nm, or about 100 nm to about 200 nm.

In a preferred embodiment, the first abrasive comprising cationically modified colloidal silica particles have an average particle size of about 110 nm.

In another preferred embodiment, the second abrasive particles having a Mohs hardness of about 5.5 or more have an average particle size of about 70 nm to about 110 nm.

In an embodiment, the cationically modified colloidal silica particles have an average particle size of about 50 nm to about 200 nm, for example, about 55 nm, about 60 nm, about 65 nm, about 70 nm, about 75 nm, about 80 nm, about 85 nm, about 90 nm, about 95 nm, about 100 nm, about 105 nm, about 110 nm, about 115 nm, about 120 nm, about 125 nm, about 130 nm, about 135 nm, about 140 nm, about 145 nm, about 150 nm, about 155 nm, about 160 nm, about 165 nm, about 170 nm, about 175 nm, about 180 nm, about 185 nm, about 190 nm, or about 195 nm.

In another embodiment, the cationically modified colloidal silica particles have an average particle size of about 100 nm to about 140 nm.

The polishing composition can comprise any suitable amount of abrasive (i.e., first abrasive comprising cationically modified colloidal silica particles and second abrasive having a Mohs hardness of about 5.5 or more). If the polishing composition of the invention comprises too little abrasive, the composition may not exhibit sufficient removal rate. In contrast, if the polishing composition comprises too much abrasive, the composition may exhibit undesirable polishing performance, may cause surface defects such as scratches, may not be cost effective, and/or may lack stability. The polishing composition can comprise about 10 wt. % or less of abrasive, for example, about 9 wt. % or less, about 8 wt. % or less, about 7 wt. % or less, about 6 wt. % or less, or about 5 wt. % or less. Alternatively, or in addition, the polishing composition can comprise about 0.01 wt. % or more of abrasive, for example, about 0.05 wt. % or more, about 0.1 wt. % or more, about 0.2 wt. % or more, about 0.3 wt. % or more, about 0.4 wt. % or more, about 0.5 wt. % or more, or about 1 wt. % or more. Thus, the polishing composition can comprise abrasive in an amount bounded by any two of the aforementioned endpoints. For example, the polishing composition can comprise about 0.01 wt. % to about 10 wt. % of abrasive, e.g., about 0.05 wt. % to about 9.5 wt. %, about 0.1 wt. % to about 9 wt. % of abrasive, about 0.1 wt. % to about 8 wt. % of abrasive, about 0.1 wt. % to about 7 wt. % of abrasive, about 0.1 wt. % to about 6 wt. % of abrasive, about 0.1 wt. % to about 5 wt. % of abrasive, about 0.1 wt. % to about 5 wt. % of abrasive, about 0.2 wt. % to about 5 wt. % of abrasive, about 0.3 wt. % to about 5 wt. % of abrasive, about 0.4 wt. % to about 5 wt. % of abrasive, about 0.5 wt. % to about 5 wt. % of abrasive, about 0.6 wt. % to about 5 wt. % of abrasive, about 0.7 wt. % to about 5 wt. % of abrasive, about 0.8 wt. % to about 5 wt. % of abrasive, about 0.9 wt. % to about 5 wt. % of abrasive, or about 1 wt. % to about 5 wt. % of abrasive.

In an embodiment, the polishing composition comprises about 0.05 wt. % to about 5 wt. % of abrasive. In another embodiment, the polishing composition comprises about 0.15 wt. % to about 2 wt. % of abrasive.

The first abrasive can be present in the polishing composition in any suitable amount. In an embodiment, the cationically modified colloidal silica particles are present in the polishing composition in an amount of about 0.05 wt. % to about 5 wt. %.

In an embodiment, the cationically modified colloidal silica particles are present in the polishing composition in an amount of about 1 wt. %.

The second abrasive can be present in the polishing composition in any suitable amount. Without wishing to be bound to a particular theory, if too little second abrasive is present, the polishing composition may not exhibit suitable barrier layer removal rates. If too much second abrasive is present, an additional increase in barrier layer removal rates may not be observed and the polishing composition may not be cost effective. Typically, the second abrasive is present in the polishing composition in a lower amount than the first abrasive. For example, in an embodiment, the second abrasive is present in the polishing composition in an amount of about 25 ppm on a weight basis (i.e., about 0.0025 wt. %) or higher, for example, about 30 ppm, about 35 ppm, about 40 ppm, about 45 ppm, about 50 ppm, about 55 ppm, about 60 ppm, about 65 ppm, about 70 ppm, about 75 ppm, about 80 ppm, about 85 ppm, about 90 ppm, about 95 ppm, about 100 ppm, about 125 ppm, about 150 ppm, about 175 ppm, about 200 ppm, about 225 ppm, about 250 ppm, about 275 ppm, about 300 ppm, about 325 ppm, about 350 ppm, about 375 ppm, about 400 ppm, about 425 ppm, about 450 ppm, about 475 ppm, about 500 ppm, about 525 ppm, about 550 ppm, about 575 ppm, about 600 ppm, about 625 ppm, about 650 ppm, about 675 ppm, about 700 ppm, about 725 ppm, about 750 ppm, about 775 ppm, about 800 ppm, about 825 ppm, about 850 ppm, about 875 ppm, about 900 ppm, about 925 ppm, about 950 ppm, about 975 ppm, or about 1,000 ppm (i.e., about 0.1 wt. %). Thus, the second abrasive can be present in the polishing composition in an amount of about 0.0025 wt. % to about 0.1 wt. %, e.g., about 0.005 wt. % to about 0.75 wt. %, about 0.0075 wt. % to about 0.6 wt. %, about 0.01 wt. % to about 0.5 wt. %, or about 0.02 wt. % to about 0.25 wt. %.

In an embodiment, the second abrasive is present in the polishing composition in an amount of about 50 ppm to about 500 ppm. In another embodiment, the second abrasive is present in the polishing composition in an amount of about 150 ppm.

In a preferred embodiment, the second abrasive is α-alumina and is present in the polishing composition in an amount of 150 ppm (0.015 wt. %).

When the abrasive particles are suspended in the polishing composition, the abrasive particles desirably are colloidally stable. As used herein, the term "colloidally stable" refers to the suspension of abrasive particles in the liquid carrier (e.g., water) and refers to the maintenance of that suspension over time. In the context of the present invention, abrasive particles are considered colloidally stable if, when the abrasive particles are placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). The value of $[B]-[T]/[C]$ desirably is less than or equal to 0.3, and preferably is less than or equal to 0.1.

The inventive polishing composition comprises a cationic polymer. As used herein, cationic polymer refers to a polymer having a net positive charge at the conditions of interest (e.g., polishing conditions). Without wishing to be bound to a particular theory, Applicants have surprisingly discovered that a polishing composition as described herein comprising a cationic polymer provides suitable barrier layer (i.e., film) removal rates in bulk tungsten polishing.

The cationic polymer can comprise, consist essentially of, or consist of any suitable cationic polymer. Exemplary cationic polymers include polymers comprising quaternary ammonium groups, including copolymers of quaternary ammonium containing monomers/polymers and acrylamide monomers/polymers (e.g., amino acrylate polymers). Exemplary cationic polymers also include homopolymers of cationic monomers, e.g., a poly(diallyldimethylammonium) halide such as poly(diallyldimethylammonium)chloride (polyDADMAC), a poly(methacryloyloxyethyltrimethylammonium)halide such as poly(methacryloyloxyethyltrimethylammonium)chloride (polyMADQUAT), and the like. In addition, the cationic polymer can be a copolymer of cationic and nonionic monomers (e.g., alkylacrylates, alkylmethacrylates, acrylamide, styrene, and the like), such as poly(acrylamide-co-diallyldimethylammonium)chloride (polyAAm-DADMAC), and poly(dimethylamine-co-epichlorohydrin-co-ethylenediamine) (polyDEE). Some other non-limiting examples of suitable cationic polymers include polyethyleneimine, ethoxylated polyethyleneimine, poly(diallyldimethylammonium)halide, poly(amidoamine), poly(methacryloyloxyethyldimethylammonium)chloride, poly(vinylpyrrolidone), poly(vinylimidazole), poly(vinylpyridine), and poly)vinylamine). In a preferred embodiment, the cationic polymer is polyDADMAC. In another preferred embodiment, the cationic polymer is polyMADQUAT. In yet another preferred embodiment, the cationic polymer is polylysine.

Alternatively, or in addition, the cationic polymer can include nitrogen-heteroaryl or quaternized nitrogen-heteroaryl groups, i.e., heteroaromatic compounds comprising at least one nitrogen in an aromatic ring, optionally having at least one of the nitrogen atoms in the ring alkylated to impart a formal positive charge on the heteroaryl ring (e.g., on a nitrogen in the ring). Preferably, the heteroaryl group is attached to the backbone of the polymer through a carbon-carbon bond (e.g., as in a quaternized poly(vinylpyridine) polymer) or a carbon-nitrogen bond (e.g., as in a quaternized poly(vinylimidazole)polymer) either directly to the aromatic ring or through an alkylene spacer group (e.g., methylene ($CH_2$) or ethylene ($CH_2CH_2$) group). The positive charge on the quaternized nitrogen is balanced by a counter anion, which can be, e.g., a halide (e.g., chloride), nitrate, methylsulfate, or a combination of anions. In some embodiments, the cationic polymer comprises, consists essentially of, or consists of a poly(vinyl-N-alkylpyridinium)polymer, such as a poly(2-vinyl-N-alkylpyridinium)polymer, a poly(4-vinyl-N-alkylpyridinium)polymer, a vinyl-N-alkylyridinium copolymer, a poly(N1-vinyl-N3-alkylimidazolium)polymer, and the like.

The cationic polymer also can comprise, consist essentially of, or consist of polycationic amines. As used herein, a polycationic amine is an amine compound having more than one (e.g., two or more) amine groups in which each of the amine groups is cationic (i.e., has a positive charge). Thus, the polycationic amine can comprise a polyquaternary amine. As used herein, polyquaternary amine refers to an amine compound having from 2 to 4 quaternary ammonium groups such that the polyquaternary amine is a diquaternary amine, a triquaternary amine, or a tetraquaternary amine compound. Suitable diquaternary amine compounds include, for example, N,N'-methylenebis(dimethyltetradecylammonium bromide), 1,1,4,4-tetrabutylpiperazinediium dibromide, N,N,N',N',N'-pentamethyl-N-tallow-1,3-propane-diammonium dichloride, N,N'-hexamethylenebis (tributylammonium hydroxide), decamethonium bromide, didodecyl-tetramethyl-1,4-butanediaminium diiodide, 1,5-dimethyl-1,5-diazoniabicyclo(3.2.2)nonane dibromide, and the like. Suitable triquaternary amine compounds include, for example, N(1),N(6)-didoecyl-N(1),N(1),N(6),N(6)-tetramethyl-1,6-hexanediaminium diiodide. Suitable tetraquaternary amine compounds include, for example, methanetetrayltetrakis(tetramethylammonium bromide). The polyquaternary amine compound can further include a long chain alkyl group (e.g., having 10 or more carbon atoms). For example, suitable polyquaternary amine compounds having a long chain alkyl group include N,N'-methylenebis(dimethyltetradecylammonium bromide), N,N,N',N',N'-pentamethyl-N-tallow-1,3-propane-diammonium dichloride, didodecyl-tetramethyl-1,4-butanediaminium diiodide, and N(1),N(6)-didodecyl-N(1),N(1),N(6),N(6)-tetramethyl-1,6-hexanediaminium diiodide.

A polycationic amine can also be polycationic in that each of the amine groups is protonated (and therefore has a positive charge). For example, a dicationic amine such as tetramethyl-p-phenylenediamine includes two tertiary amine groups that can be protonated (and therefore positively charged) at polishing composition pH values less than the pKa of the amine compound.

In an embodiment, the cationic polymer is selected from polycationic amines, polylysine, and combinations thereof. In an embodiment, the cationic polymer comprises a polycationic amine. In another embodiment, the cationic polymer comprises polylysine.

The cationic polymer (e.g., copolymer) can have any suitable molecular weight. The cationic polymer typically has an average molecular weight of about 100,000 g/mol or less, for example, about 95 kDa or less, about 90 kDa or less, about 85 kDa or less, about 80 kDa or less, about 75 kDa or less, about 70 kDa or less, about 65 kDa or less, about 60 kDa or less, about 55 kDa or less, about 50 kDa or less, about 45 kDa or less, about 40 kDa or less, about 35 kDa or less, about 30 kDa or less, about 25 kDa or less, or about 20 kDa or less.

Thus, the cationic polymer can have an average molecular weight of about 500 g/mol or more, for example, about 1,000 g/mol or more, about 1,500 g/mol or more, about 2,000 g/mol or more, about 2,500 g/mol or more, about 3,000 g/mol or more, about 3,500 g/mol or more, about 4,000 g/mol or more, about 4,500 g/mol or more, about 5,000 g/mol or more, about 5,500 g/mol or more, about 6,000 g/mol or more, about 6,500 g/mol or more, about 7,000 g/mol or more, about 7,500 g/mol or more, about 8,000 g/mol or more, about 8,500 g/mol or more, about 9,000 g/mol or more, about 9,500 g/mol or more, or about 10,000 g/mol or more. Alternatively, or in addition, the cationic polymer can have an average molecular weight of about 15,000 g/mol or less, for example, about 14,500 g/mol or less, about 14,000 g/mol or less, about 13,500 g/mol or less, for example, about 13,000 g/mol or less, about 12,500 g/mol or less, about 12,000 g/mol or less, about 11,500 g/mol or less, about 11,000 g/mol or less, or about 10,500 g/mol or less. Thus, the cationic polymer can have an average molecular weight bounded by any two of the aforementioned endpoints. For example, the cationic polymer can have an average molecular weight of about 500 g/mol to about 15,000 g/mol, about 1,000 g/mol to about 14,500 g/mol, about 1,500 g/mol to about 14,000 g/mol, about 2,000 g/mol to about 13,500 g/mol, about 2,500 g/mol to about 13,000 g/mol, about 3,000 g/mol to about 12,500 g/mol, about 3,500 g/mol to about 12,000 g/mol, about 4,000 g/mol to about 11,500 g/mol, about 4,500 g/mol to about 11,000 g/mol, about 5,000 g/mol to about 10,500 g/mol, about 5,500 g/mol to about 10,000 g/mol, to about 6,000 g/mol to about 9,500 g/mol, to about 6,500 g/mol to about 9,000 g/mol, about 7,000 g/mol to about 8,500 g/mol, or about 7,500 g/mol to about 8,000 g/mol.

In a preferred embodiment, the cationic polymer has a molecular weight of about 2,000 g/mol to about 15,000 g/mol.

In another preferred embodiment, the cationic polymer has a molecular weight of about 8,500 g/mol.

The polishing composition can comprise any suitable amount of the cationic polymer. Without wishing to be bound to a particular theory, it is believed that typically there is an inverse relationship between the average molecular weight of the cationic polymer and the barrier layer removal rate. That is, as the molecular weight of the cationic polymer increases the barrier layer removal rate may decrease. In such situations, the amount of the cationic polymer and/or the hardness of the second abrasive may be adjusted accordingly.

The cationic polymer can be present in the polishing composition in any suitable amount. Typically, the cationic polymer is present in the polishing composition in an amount of about 1 ppm or more (on a weight basis), for example, about 5 ppm or more, about 10 ppm or more, about 15 ppm or more, about 20 ppm or more, about 25 ppm or more, about 30 ppm or more, about 35 ppm or more, about 40 ppm or more, about 45 ppm or more, or about 50 ppm or more. Alternatively, or in addition, the cationic polymer can be present in the polishing composition in an amount of about 100 ppm or less, about 95 ppm or less, about 90 ppm or less, about 85 ppm or less, about 80 ppm or less, about 75 ppm or less, about 70 ppm or less, about 65 ppm or less, about 60 ppm or less, or about 55 ppm or less. Thus, the cationic polymer can be present in the polishing composition in an amount bounded by any of the aforementioned values. For example, the cationic polymer can be present in the polishing composition in an amount of about 1 ppm to about 100 ppm.

In a preferred embodiment, the cationic polymer is present in an amount of about 5 ppm to about 100 ppm. In another preferred embodiment, the cationic polymer is present in an amount of about 10 ppm to about 50 ppm. In yet another preferred embodiment, the cationic polymer is present in an amount of about 15 ppm to about 30 ppm.

The polishing composition contains an iron-containing activator. An iron-containing activator is an iron-containing chemical compound that facilitates the removal rate of tungsten during a tungsten CMP operation. For example, the iron-containing activator can include an iron-containing catalyst such as is disclosed in U.S. Pat. Nos. 5,958,288 and 5,980,775. The iron-containing activator can comprise, consist essentially of, or consist of a soluble iron salt, e.g., soluble in the aqueous carrier, and can include, for example, ferric (iron III) or ferrous (iron II) compounds such as iron nitrate, iron sulfate, and iron halides, including fluorides, chlorides, bromides, and iodides, as well as perchlorates, perbromates and periodates, and iron-containing organic compounds such as iron acetates, iron acetylacetonates, iron citrates, iron gluconates, iron malonates, iron oxalates, iron phthalates, and iron succinates, and combinations thereof. In an embodiment, the iron-containing activator is ferric nitrate.

The polishing composition can comprise any suitable amount of the iron-containing activator. If the polishing composition contains too little iron containing activator, the tungsten removal rate may not be suitable. In contrast, if the polishing composition contains too much iron containing activator, the polishing composition may be unstable or not cost effective. The iron-containing activator can be present in the polishing composition in an amount of about 10 ppm (on a weight basis) or more, for example, about 25 ppm or more, about 50 ppm or more, about 75 ppm or more, about 100 ppm or more, about 125 ppm or more, about 150 ppm or more, about 175 ppm or more, about 200 ppm or more, about 225 ppm or more, about 250 ppm or more, about 275 ppm or more, about 300 ppm or more, about 325 ppm or more, or about 350 ppm or more. Alternatively, or in addition, the iron-containing activator can be present in the polishing composition in an amount of 1,000 ppm or less, for example, about 975 ppm or less, about 950 ppm or less, about 925 ppm or less, about 900 ppm or less, about 875 ppm or less, about 850 ppm or less, about 825 ppm or less, about 800 ppm or less, about 775 ppm or less, about 750 ppm or less, about 725 ppm or less, about 700 ppm or less, about 675 ppm or less, about 650 ppm or less about 625 ppm or less, about 600 ppm or less, about 575 ppm or less, about 550 ppm or less, about 525 ppm or less, about 500 ppm or less, about 475 ppm or less, about 450 ppm or less, about 425 ppm or less, about 400 ppm or less, or about 375 ppm or less. Thus, the iron-containing activator can be present in the polishing composition in an amount bounded by any two of the aforementioned endpoints. For example, the iron containing activator can be present in the polishing composition in an amount of about 10 ppm to about 1,000 ppm, e.g., about 25 ppm to about 975 ppm, about 50 ppm to about 950 ppm, about 75 ppm to about 925 ppm, or about 100 ppm to about 900 ppm.

In an embodiment, the iron from the iron-containing activator is present in the polishing composition in an amount of about 1 ppm to about 100 ppm (on a weight basis). In another embodiment, the iron from iron-containing activator is present in the polishing composition in an amount of about 50 ppm. In another embodiment, the iron from the iron-containing activator is present in the polishing composition in an amount of about 60 ppm.

In some embodiments, the polishing composition comprising an iron-containing activator can further include a stabilizer. Without wishing to be bound to any particular theory, it is believed that the stabilizer prevents the iron-containing activator from degrading the oxidizing agent over time. It is believed that the addition of a stabilizer can reduce the effectiveness of the iron-containing activator, such that the choice of the type and amount of stabilizer may impact on CMP performance. More specifically, it is believed that the addition of a stabilizer may lead to the formation of a stabilizer/activator complex (e.g., the stabilizer binds to the soluble iron salt) that inhibits the activator from reacting with the oxidizing agent while at the same time allowing the activator to remain sufficiently active so as to promote (e.g., facilitate) rapid tungsten polishing rates. In an embodiment, the stabilizer is selected from phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and combinations thereof.

In a preferred embodiment, the stabilizer comprises malonic acid.

The polishing composition can comprise any suitable amount of stabilizer. If the polishing composition contains too little stabilizer, then the iron containing activator may degrade too quickly and the polishing performance of the polishing composition may not be suitable. In contrast, if the polishing composition contains too much stabilizer, then the polishing composition may be unstable and may not be cost effective. Typically, the stabilizer is present in the polishing composition in an amount of about 20 ppm or more (on a weight basis), for example, about 50 ppm or more, about 100 ppm or more, about 150 ppm or more, about 200 ppm or more, about 250 ppm or more, about 300 ppm or more, about 350 ppm or more, about 400 ppm or more, about 450 ppm or more, about 500 ppm or more, about 550 ppm or more, about 600 ppm or more, about 650 ppm or more, about 700 ppm or more, about 750 ppm or more, about 800 ppm or more, about 850 ppm or more, about 900 ppm or more, about 950 ppm or more, or about 1,000 ppm or more. Alternatively, or in addition, the stabilizer can be present in the polishing composition in an amount of about 2,000 ppm or less, about 1,950 ppm or less, about 1,900 ppm or less, about 1,850 ppm or less, about 1,800 ppm or less, about 1,750 ppm or less, about 1,700 ppm or less, about 1,650 ppm or less, about 1,600 ppm or less, about 1,550 ppm or less, about 1,500 ppm or less, about 1,450 ppm or less, about 1,400 ppm or less, about 1,350 ppm or less, about 1,300 ppm or less, about 1,250 ppm or less, about 1,200 ppm or less, about 1,150 ppm or less, about 1,100 ppm or less, or about 1,050 ppm or less. Thus, the stabilizer can be present in the polishing composition in an amount bounded by any two of the aforementioned endpoints. For example, the stabilizer can be present in the polishing composition in an amount of about 50 ppm to about 2,000 ppm, about 100 ppm to about 1,950 ppm, about 150 ppm to about 1,900 ppm, about 200 ppm to about 1,850 ppm, about 250 ppm to about 1,800 ppm, about 250 ppm to about 1,800 ppm, about 300 ppm to about 1,750 ppm, about 350 ppm to about 1,700 ppm, about 400 ppm to about 1,650 ppm, about 450 ppm to about 1,600 ppm, about 500 ppm to about 1,550 ppm, about 550 ppm to about 1,500 ppm, about 600 ppm to about 1,450 ppm, about 650 ppm to about 1,400 ppm, about 700 ppm to about 1,350 ppm, about 750 ppm to about 1,300 ppm, about 800 ppm to about 1,250 ppm, about 850 ppm to about 1,100 ppm, about 900 ppm to about 1,050 ppm, or about 950 ppm to about 1,000 ppm.

The polishing composition comprises an oxidizing agent. The oxidizing agent oxidizes a metal layer to its corresponding oxide or hydroxide, e.g., aluminum to aluminum oxide, titanium to titanium oxide, tungsten to tungsten oxide, and copper to copper oxide. The polishing composition can comprise any suitable oxidizing agent provided that the oxidizing agent is water-soluble and compatible with the other components of the composition. For example, the inclusion of an oxidizing agent in the polishing composition should not result in an unstable polishing composition or unsuitable polishing performance. Moreover, a person of ordinary skill in the art will understand that the choice of oxidizing agent should be compatible with the particular polishing application. For example, in some polishing applications it may be undesirable that the substrate is contaminated by an alkali metal, alkaline earth metal, halide. The oxidizing agent may be added to the polishing composition during the slurry manufacturing process or just prior to the CMP operation (e.g., in a tank located at the semiconductor fabrication facility).

Suitable oxidizing agents are known in the art and include, for example, peroxides (e.g., hydrogen peroxide and its adducts such as urea hydrogen peroxide; percarbonates; organic peroxides such as benzoyl peroxide, peracetic acid, and di-t-butyl peroxide; monopersulfates ($SO_5^{-2}$), dipersulfates ($SO_2O_8^{-2}$), and sodium peroxide), potassium nitrate, and potassium iodate. Other suitable oxidizing agents include compounds having an element in its highest oxidation state (e.g., periodic acid, periodate salts, perbromic acid, perbromate salts, perchloric acid, perchloric salts, perboric acid, perborate salts, and permanganates). Still other suitable oxidizing agents include non-per compounds (e.g., bromates, chlorates, iodates, iodic acid, and cerium (IV) compounds such as ammonium cerium nitrate). In some embodiments, the polishing composition comprises more than one oxidizing agent.

In a preferred embodiment, the oxidizing agent is hydrogen peroxide.

The polishing composition can comprise any suitable amount of oxidizing agent. If the concentration of the oxidizing agent(s) in the polishing composition is too low, the metal substrate will not be oxidized to the metal oxide at a suitable rate, thereby hindering polishing performance (low removal rate and/or poor defect performance). In contrast, if the concentration of the oxidizing agent(s) in the polishing composition is too high, the polishing composition may exhibit undesirable polishing performance, may not be cost effective, and/or may lack stability. Accordingly, the oxidizing agent can be present in the polishing composition in an amount of about 0.1 wt. % to about 10 wt. %, e.g., about 0.1 wt. % to about 6 wt. %, about 0.2 wt. % to about 5 wt. %, about 0.3 wt. % to about 4 wt. %, about 0.5 wt. % to about 3 wt. %, or about 0.25 wt. % to about 2 wt. %. For example, the oxidizing agent can be present in the polishing composition in an amount of about 1 wt. %.

The polishing composition optionally further comprises additional components (i.e., additives) as needed. For example, depending on the desired polishing application, the inventive polishing composition can comprise one or more additives to improve or enhance the polishing performance. The additives desirably are compatible with other components of the polishing composition. In an embodiment, the polishing composition further comprises an additive selected from amino acids, buffers, cationic surfactants, nonionic surfactants, catalysts, stabilizers, corrosion inhibitors, biocides, and combinations thereof.

In a preferred embodiment, the polishing composition comprises a biocide. Suitable biocides include, for example, an isothiazolinone biocide. The amount of biocide present in the polishing composition typically is about 1 to about 50 ppm, preferably about 10 ppm to about 20 ppm. An exemplary biocide is the KATHON™ line of biocides commercially available from Dow Chemical.

The polishing composition includes an aqueous carrier. The aqueous carrier comprises, consists essentially of, or consists of water (e.g., deionized water) and can contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N, N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

As described herein, the inventive polishing compositions have an acidic pH, that is, a pH that is less than 7. More specifically, the polishing composition desirably has a pH of about 2 to about 5. Tus, the polishing composition can have a pH of about 2 or more, e.g., about 2.1 or more, about 2.2 or more, about 2.3 or more, about 2.4 or more, about 2.5 or more, about 2.6 or more, about 2.7 or more, about 2.8 or more, about 2.9 or more, about 3.0 or more, about 3.1 or more, about 3.2 or more, about 3.3 or more, or about 3.4 or more. Alternatively, or in addition, the polishing composition can have a pH of about 5 or less, e.g., about 4.9 or less, about 4.8 or less, about 4.7 or less, about 4.6 or less, about 4.5 or less, about 4.4 or less, about 4.3 or less, about 4.2 or less, about 4.1 or less, about 4 or less, about 3.9 or less, about 3.8 or less, about 3.7 or less, about 3.6 or less, or about 3.5 or less. Tus, the polishing composition can have a pH bounded by any two of the aforementioned endpoints. For example, the polishing composition can have a pH of about 2 to about 5, e.g., about 2.1 to about 5, about 2.2 to about 4.9, about 2.3 to about 4.8, about 2.4 to about 4.7, about 2.5 to about 4.6, about 2.6 to about 4.5, about 2.7 to about 4.4, about 2.8 to about 4.3, about 2.9 to about 4.2, about 3.0 to about 4.1, about 3.1 to about 4.0, or about 3.2 to about 3.9.

The pH of the polishing composition can be adjusted as necessary using any suitable acid or base. Non-limiting examples of suitable acids include nitric acid, sulfuric acid, and organic acids such as formic acid and acetic acid. Non-limiting examples of suitable bases include sodium hydroxide, potassium hydroxide, and ammonium hydroxide.

In an embodiment, the polishing composition has a pH of about 2 to about 4. In another embodiment, the polishing composition has a pH of about 2.

It will be understood that any of the components of the polishing composition that are acids, bases, or salts (e.g., cationic polymer, oxidizing agent, catalyst, etc.), when dissolved in the aqueous carrier of the polishing composition, can exist in dissociated form as cations and anions. The amounts of such compounds present in the polishing composition as recited herein will be understood to refer to the weight of the undissociated compound used in the preparation of the polishing composition.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., first abrasive comprising cationically modified colloidal silica particles, second abrasive having a Mohs hardness of about 5.5 or more, cationic polymer, etc.) as well as any combination of ingredients (e.g., first abrasive comprising cationically modified colloidal silica particles, second abrasive having a Mohs hardness of about 5.5 or more, cationic polymer, iron containing activator, or one or more additives, etc.).

For example, the abrasive particles can be added to the aqueous carrier (e.g., water) at the desired concentration(s). The pH can then be adjusted (as desired) and the cationic polymer and other components can be added to the mixture at the desired concentration to form the polishing composition. The polishing composition can be prepared prior to use, with one or more components added to the polishing composition just before use (e.g., within about 1 minute before use, or within about 1 hour before use, or within about 7 days before use). The polishing composition also can be prepared by mixing the components at the surface of the substrate during the polishing operation.

The polishing composition also can be provided as a concentrate which is intended to be diluted with an appropriate amount of the aqueous carrier, particularly water, prior to use. In such an embodiment, the polishing composition concentrate can comprise first abrasive, second abrasive, cationic polymer, iron-containing activator, oxidizing agent, additive(s) (if present), and an aqueous carrier, in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that other components are at least partially or fully dissolved in the concentrate.

While the polishing composition can be prepared well before, or even shortly before, use, the polishing composition also can be produced by mixing the components of the polishing composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high-pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The invention also provides a method of chemically mechanically polishing a substrate comprising (i) providing a substrate, (ii) providing a polishing pad, (iii) providing a chemical-mechanical polishing composition comprising (a) a first abrasive comprising cationically modified colloidal silica particles, (b) a second abrasive having a Mohs hardness of about 5.5 or more, (c) a cationic polymer, (d) an iron containing activator, (e) an oxidizing agent, and (f) water, (iv) contacting the substrate with the polishing pad and the chemical-mechanical polishing composition, and (v) moving the polishing pad and the chemical mechanical polishing composition relative to the substrate to abrade at least a portion of the substrate to polish the substrate.

Applicants have surprisingly discovered that a polishing composition comprising (a) a first abrasive comprising cationically modified colloidal silica particles, (b) a second abrasive having a Mohs hardness of about 5.5 or more, (c) a cationic polymer, (d) an iron containing activator, (e) an oxidizing agent, and (f) water provides improved barrier film removal rates. For example, in some embodiments the removal rate of the barrier film, e.g., titanium nitride (TiN) and/or titanium (Ti), is increased by factor of about two or more, for example, about three or more, about 4 or more as comparted to conventional polishing compositions. Thus, in an embodiment, the substrate comprises a layer of titanium nitride (TiN) and/or a layer of titanium (Ti) on a surface of the substrate, wherein at least a portion of the TiN layer and/or Ti layer is abraded to polish the substrate.

In some embodiments, the substrate further comprises an oxide, e.g., tetraethyl orthosilicate (TEOS). Tus, the substrate can comprise a layer of an oxide, or a layer of TEOS in particular, on a surface of the substrate, wherein at least a portion of the oxide layer, or at least a portion of the TEOS layer in particular, is abraded to polish the substrate.

In the inventive method, no significant reduction in the removal rate of tungsten or TEOS is observed as compared to conventional polishing compositions. In addition, no significant degradation of topography is observed. Further, no significant increase in defectivity is observed.

Although the polishing composition of the invention may be used to polish any substrate, the polishing composition is particularly useful in the polishing of a substrate comprising at least one metal including tungsten and at least one dielectric material. The tungsten layer may be deposited over one or more barrier layers, for example, including titanium (Ti) and/or titanium nitride (TiN). The dielectric layer may be a metal oxide such as a silicon oxide layer derived from tetraethylorthosilicate (TEOS), porous metal oxide, porous or non-porous carbon doped silicon oxide, fluorine-doped silicon oxide, glass, organic polymer, fluorinated organic polymer, or any other suitable high or low-k insulating layer.

In a preferred embodiment, the substrate comprises a titanium layer on a surface of the substrate, wherein at least a portion of the titanium layer is abraded to polish the substrate.

In another preferred embodiment, the substrate comprises a nitride layer on a surface of the substrate, wherein at least a portion of the nitride layer is abraded to polish the substrate.

In a preferred embodiment, the nitride layer is selected from titanium nitride, silicon nitride, and combinations thereof.

In another preferred embodiment, the substrate comprises a silicon oxide layer on a surface of the substrate, wherein at least a portion of the silicon oxide layer is abraded on to polish the substrate.

In a preferred embodiment, the silicon oxide layer comprises TEOS.

In another preferred embodiment, the substrate comprises a tungsten layer on a surface of the substrate, wherein at least a portion of the tungsten layer is abraded to polish the substrate.

In another preferred embodiment, the substrate comprises both a tungsten layer and a titanium nitride layer on a surface of the substrate, wherein both the tungsten layer and the titanium nitride layer are abraded to polish the substrate.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, co-formed products thereof, and mixtures thereof. Soft polyurethane polishing pads are particularly useful in conjunction with the inventive polishing method. Typical pads include but are not limited to SURFIN™ 000, SURFIN® SSW1, SPM3100 Eminess Technologies), POLITEX™ commercially available from Dow Chemical Company (Newark, Del.), and POLYPAS™ 27 commercially available from Fujibo (Osaka, JP), and EPIC™ D100 pads or NEXPLANAR™ E6088 commercially available from Cabot Microelectronics (Aurora, Ill.). A preferred polishing pad is the rigid, microporous polyurethane pad (IC1010™) commercially available from Dow Chemical.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

EMBODIMENTS (1) In embodiment (1) is presented a chemical-mechanical polishing composition comprising (a) a first abrasive comprising cationically modified colloidal silica particles, (b) a second abrasive having a Mohs hardness of about 5.5 or more, (c) a cationic polymer, (d) an iron containing activator, (e) an oxidizing agent, and (f) water.

(2) In embodiment (2) is presented the polishing composition of embodiment (1), wherein the cationically modified colloidal silica particles have a zeta potential of greater than about 20 mV at a pH of about 2.5.

(3) In embodiment (3) is presented the polishing composition of embodiment (1) or embodiment (2), wherein the cationically modified colloidal silica particles have an average particle size of about 50 nm to about 200 nm.

(4) In embodiment (4) is presented the polishing composition of any one of embodiments (1)-(3), wherein the cationically modified colloidal silica particles are present in the polishing composition in an amount of about 0.05 wt. % to about 5 wt. %.

(5) In embodiment (5) is presented the polishing composition of any one of embodiments (1)-(4), wherein the second abrasive is selected from α-alumina particles, zirconia particles, diamond particles, and combinations thereof.

(6) In embodiment (6) is presented the polishing composition of any one of embodiments (1)-(5), wherein the second abrasive comprises α-alumina particles.

(7) In embodiment (7) is presented the polishing composition of any one of embodiments (1)-(6), wherein the second abrasive is present in the polishing composition in an amount of about 25 ppm or higher.

(8) In embodiment (8) is presented the polishing composition of embodiment (7), wherein the second abrasive is present in the polishing composition in an amount of about 50 ppm to about 500 ppm.

(9) In embodiment (9) is presented the polishing composition of any one of embodiments (1)-(8), wherein the cationic polymer has a molecular weight of about 100,000 g/mol or less.

(10) In embodiment (10) is presented the polishing composition of embodiment (9), wherein the cationic polymer has a molecular weight of about 2,000 g/mol to about 15,000 g/mol.

(11) In embodiment (11) is presented the polishing composition of any one of embodiments (1)-(10), wherein the cationic polymer is polydiallyldimethylammonium chloride (pDADMAC).

(12) In embodiment (12) is presented the polishing composition of any one of embodiments (1)-(11), wherein the cationic polymer is present in the polishing composition in an amount of about 1 to about 100 ppm.

(13) In embodiment (13) is presented the polishing composition of any one of embodiments (1)-(12), wherein the iron containing activator comprises a soluble iron salt.

(14) In embodiment (14) is presented the polishing composition of embodiment (13), wherein the soluble iron salt is ferric nitrate.

(15) In embodiment (15) is presented the polishing composition of any one of embodiments (1)-(14), wherein the iron containing activator is present in the polishing composition in an amount of about 10 ppm to about 700 ppm.

(16) In embodiment (16) is presented the polishing composition of embodiment (13) or embodiment (14), further comprising a stabilizer bound to the soluble iron salt, wherein the stabilizer is selected from phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and combinations thereof.

(17) In embodiment (17) is presented the polishing composition of embodiment (16), wherein the stabilizer is present in the polishing composition in an amount of about 20 ppm to about 2,000 ppm.

(18) In embodiment (18) is presented the polishing composition of any one of embodiments (1)-(17), wherein the oxidizing agent is hydrogen peroxide.

(19) In embodiment (19) is presented the polishing composition of any one of embodiments (1)-(18), further comprising an additive selected from an amino acid, a buffer, a biocide, a cationic surfactant, a corrosion inhibitor, and combinations thereof.

(20) In embodiment (20) is presented the polishing composition of embodiment (19), wherein the additive comprises a biocide.

(21) In embodiment (21) is presented the polishing composition of any one of embodiments (1)-(20), wherein the polishing composition has a pH of about 2 to about 4.

(22) In embodiment (22) is presented a method of chemically mechanically polishing a substrate comprising (i) providing a substrate, (ii) providing a polishing pad, (iii) providing a chemical-mechanical polishing composition comprising (a) a first abrasive comprising cationically modified colloidal silica particles, (b) a second abrasive having a Mohs hardness of about 5.5 or more, (c) a cationic polymer, (d) an iron containing activator, (e) an oxidizing agent, and (f) water, (iv) contacting the substrate with the polishing pad and the chemical-mechanical polishing composition, and (v) moving the polishing pad and the chemical mechanical polishing composition relative to the substrate to abrade at least a portion of the substrate to polish the substrate.

(23) In embodiment (23) is presented the method of embodiment (22), wherein the cationically modified colloidal silica particles have a zeta potential of greater than about 20 mV at a pH of about 2.5.

(24) In embodiment (24) is presented the method of embodiment (22) or (23), wherein the cationically modified colloidal silica particles have an average particle size of about 50 nm to about 200 nm.

(25) In embodiment (25) is presented the method of any one of embodiments (22)-(24), wherein the cationically modified colloidal silica particles are present in the polishing composition in an amount of about 0.05 wt. % to about 5 wt. %.

(26) In embodiment (26) is presented the method of any one of embodiments (22)-(25), wherein the second abrasive is selected from α-alumina particles, zirconium particles, diamond particles, and combinations thereof.

(27) In embodiment (27) is presented the method of any one of embodiments (22)-(26), wherein the second abrasive comprises α-alumina particles.

(28) In embodiment (28) is presented the method of any one of embodiments (22)-(27), wherein the second abrasive is present in the polishing composition in an amount of about 25 ppm or higher.

(29) In embodiment (29) is presented the method of embodiment (28), wherein the second abrasive is present in the polishing composition in an amount of about 50 ppm to about 500 ppm.

(30) In embodiment (30) is presented the method of any one of embodiments (22)-(29), wherein the cationic polymer has a molecular weight of about 100,000 g/mol or less.

(31) In embodiment (31) is presented the method of embodiment (30), wherein the cationic polymer has a molecular weight of about 2,000 g/mol to about 15,000 g/mol.

(32) In embodiment (32) is presented the method of any one of embodiments (22)-(31), wherein the cationic polymer is polydiallyldimethylammonium chloride (pDADMAC).

(33) In embodiment (33) is presented the method of any one of embodiments (22)-(32), wherein the cationic polymer is present in the polishing composition in an amount of about 1 to about 100 ppm.

(34) In embodiment (34) is presented the method of any one of embodiments (22)-(33), wherein the iron containing activator comprises a soluble iron salt.

(35) In embodiment (35) is presented the method of embodiment (34), wherein the soluble iron salt is ferric nitrate.

(36) In embodiment (36) is presented the method of any one of embodiments (22)-(35), wherein the iron containing activator is present in the polishing composition in an amount of about 100 ppm to about 700 ppm.

(37) In embodiment (37) is presented the polishing composition of embodiment (34) or embodiment (35), further comprising a stabilizer bound to the soluble iron salt, wherein the stabilizer is selected from phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and combinations thereof.

(38) In embodiment (38) is presented the method of embodiment (37), wherein the stabilizer is present in the polishing composition in an amount of about 20 ppm to about 2,000 ppm.

(39) In embodiment (39) is presented the method of any one of embodiments (22)-(38), wherein the oxidizing agent is hydrogen peroxide.

(40) In embodiment (40) is presented the method of any one of embodiments (22)-(39), further comprising an additive selected from an amino acid, a buffer, a biocide, a cationic surfactant, a corrosion inhibitor, and combinations thereof.

(41) In embodiment (41) is presented the method of embodiment (40), wherein the additive comprises a biocide.

(42) In embodiment (42) is presented the method of any one of embodiments (22)-(41), wherein the polishing composition has a pH of about 2 to about 4.

(43) In embodiment (43) is presented the method of any one of embodiments (22)-(42), wherein the substrate comprises a titanium layer on a surface of the substrate, and wherein at least a portion of the titanium layer is abraded to polish the substrate.

(44) In embodiment (44) is presented the method of any one of embodiments (22)-(43), wherein the substrate comprises a nitride layer on a surface of the substrate, and wherein at least a portion of the nitride layer is abraded to polish the substrate.

(45) In embodiment (45) is presented the method of embodiment (44), wherein the nitride layer is selected from titanium nitride, silicon nitride, and combinations thereof.

(46) In embodiment (46) is presented the method of any one of embodiments (22)-(45), wherein the substrate comprises a silicon oxide layer on a surface of the substrate, and wherein at least a portion of the silicon oxide layer is abraded on to polish the substrate.

(47) In embodiment (47) is presented the method of embodiment (46), wherein the silicon oxide layer comprises TEOS.

(48) In embodiment (48) is presented the method of any one of embodiments (22)-(47), wherein the substrate comprises a tungsten layer on a surface of the substrate, and wherein at least a portion of the tungsten layer is abraded to polish the substrate.

(49) In embodiment (49) is presented the method of any one of embodiments (22)-(48), wherein the substrate comprises both a tungsten layer and a titanium nitride layer on a surface of the substrate, and wherein both the tungsten layer and the titanium nitride layer are abraded to polish the substrate.

EXAMPLES

The following examples further illustrate the invention but, of course, should not be construed as in any way limiting its scope.

The following abbreviations are used herein: W refers to tungsten; Ti refers to titanium; TiN refers to titanium nitride; TEOS refers to tetraethylorthosilicate; MW refers to molecular weight, and RR refers to removal rate.

Example 1

Tis example demonstrates the effect of a second abrasive having a Mohs hardness of about 5.5 or more on removal rates and polishing performance for polishing compositions according to the invention.

Substrates comprising blankets of TiN, Ti, W, and TEOS were polished with two polishing compositions (i.e., Polishing Compositions 1A and 1B). The polishing compositions contained the following components (3× concentrate): 1.0 wt. % of cationically modified colloidal silica as a first abrasive, 1,335 ppm malonic acid as a stabilizer, 618 ppm of ferric nitrate as an iron-containing activator; 75-150 ppm of polyDADMAC (MW of 8,500 g/mol) as a cationic polymer, 2 wt. % of hydrogen peroxide as an oxidizing agent, and 15 ppm of KATHON™ LX as a biocide. The pH of the polishing compositions was adjusted to 2.15.

Polishing Compositions 1A and 1B were identical except that polishing composition 1B further comprised 150 ppm of α-alumina as a second abrasive.

Substrates were polished using a MIRRA™ polisher (Applied Materials, Santa Clara, Calif.) and a NEXPLANAR™ E6088 polishing pad (Cabot Microelectronics, Aurora, Ill.) using 2 psi of downforce.

The polishing results are set forth in Table 1.

TABLE 1

Removal Rates as a Function of Second Abrasive

| Composition | W RR (Å/min) | TiN RR (Å/min) | Ti RR (Å/min) | TEOS RR (Å/min) |
|---|---|---|---|---|
| 1A (control) | 1,984 | 355 | 118 | 30 |
| 1B (inventive) | 1,923 | 769 | 469 | 20 |

As is apparent from the results set forth in Table 1, inventive Polishing Composition 1B exhibited increased removal rates for the TiN and Ti barrier films while maintaining a comparable tungsten and TEOS removal rate as compared to control Polishing Composition 1A. In addition, the tungsten and TEOS removal rates of control Polishing Composition 1A and inventive Polishing Composition 1B were similar with no significant differences. Thus, these results show the beneficial impact of a second abrasive particle having a Mohs hardness of about 5.5 or more on polishing compositions according to the invention.

The invention claimed is:

1. A chemical-mechanical polishing composition comprising:
   (a) a first abrasive comprising cationically modified colloidal silica particles,
   (b) a second abrasive having a Mohs hardness of about 5.5 or more, wherein the second abrasive is selected from α-alumina particles, zirconia particles, diamond particles, and combinations thereof,
   (c) a cationic polymer,
   (d) an iron containing activator,
   (e) an oxidizing agent, and
   (f) water.

2. The polishing composition of claim 1, wherein the cationically modified colloidal silica particles have a zeta potential of greater than about 20 mV at a pH of about 2.5.

3. The polishing composition of claim 1, wherein the cationically modified colloidal silica particles have an average particle size of about 50 nm to about 200 nm.

4. The polishing composition of claim 1, wherein the cationically modified colloidal silica particles are present in the polishing composition in an amount of about 0.01 wt. % to about 5 wt. %.

5. The polishing composition of claim 1, wherein the second abrasive comprises α-alumina particles.

6. The polishing composition of claim 1, wherein the second abrasive is present in the polishing composition in an amount of about 25 ppm or higher.

7. The polishing composition of claim 6, wherein the second abrasive is present in the polishing composition in an amount of about 50 ppm to about 500 ppm.

8. The polishing composition of claim 1, wherein the cationic polymer has a molecular weight of about 100,000 g/mol or less.

9. The polishing composition of claim 8, wherein the cationic polymer has a molecular weight of about 2,000 g/mol to about 15.000 g/mol.

10. The polishing composition of claim 1, wherein the cationic polymer is polydiallyldimethylammonium chloride (pDADMAC).

11. The polishing composition of claim 1, wherein the cationic polymer is present in the polishing composition in an amount of about 1 to about 100 ppm.

12. The polishing composition of claim 1, wherein the iron containing activator comprises a soluble iron salt.

13. The polishing composition of claim 12, wherein the soluble iron sa is ferric nitrate.

14. The polishing composition of claim 1, wherein iron from the iron containing activator is present in the polishing composition in an amount of about 1 ppm to about 100 ppm.

15. The polishing composition of claim 12, further comprising a stabilizer bound to the soluble iron salt, wherein the stabilizer is selected from phosphoric acid, phthalic acid, citric acid, adipic acid, oxalic acid, malonic acid, aspartic acid, succinic acid, glutaric acid, pimelic acid, suberic acid, azelaic acid, sebacic acid, maleic acid, glutaconic acid, muconic acid, ethylenediaminetetraacetic acid, propylenediaminetetraacetic acid, and combinations thereof.

16. The polishing composition of claim 15, wherein the stabilizer is present in the polishing composition in an amount of about 20 ppm to about 2,000 ppm.

17. The polishing composition of claim 1, wherein the oxidizing agent is hydrogen peroxide.

18. The polishing composition of claim 1, wherein the polishing composition has a pH of about 2 to about 4.

19. A method of chemically mechanically polishing a substrate comprising:
   (i) providing a substrate,
   (ii) providing a polishing pad,
   (iii) providing a chemical-mechanical polishing composition comprising:
      (a) a first abrasive comprising cationically modified colloidal silica particles,
      (b) a second abrasive having a Mohs hardness of about 5.5 or more,
      (c) a cationic polymer,
      (d) an iron containing activator,
      (e) an oxidizing agent, and
      (f) water,
   (iv) contacting the substrate with the polishing pad and the chemical-mechanical polishing composition, and
   (v) moving the polishing pad and the chemical mechanical polishing composition relative to the substrate to abrade at least a portion of the substrate to polish the substrate, wherein the substrate comprises both a tungsten layer and a titanium nitride layer on a surface of the substrate, and wherein both the tungsten layer and the titanium nitride layer are abraded to polish the substrate.

20. The method of claim 19, wherein the canonically modified colloidal silica particles have a zeta potential of greater than about 20 mV at a pH of about 2.5.

21. The method of claim 19, wherein the canonically modified colloidal silica particles are present in the polishing composition in an amount of about 0.05 wt. % to about 5 wt. %.

22. The method of claim 19, wherein the second abrasive is selected from α-alumina particles, zirconium particles, diamond particles, and combinations thereof.

23. The method of claim 19, wherein the second abrasive comprises α-alumina particles.

24. The method of claim 19, wherein the second abrasive is present in the polishing composition in an amount of about 25 ppm or higher.

25. The method of claim 19, wherein the cationic polymer has a molecular weight of about 100,000 g/mol or less.

26. The method of claim 25, wherein the cationic polymer is polydiallyldimethylammonium chloride (pDADMAC).

27. The method of claim 19, wherein iron from the iron-containing activator is present in the polishing composition in an amount of about 1 ppm to about 100 ppm.

28. The method of claim 19, wherein the polishing composition has a pH of about 2 to about 4.

* * * * *